(12) United States Patent
Nguyen et al.

(10) Patent No.: US 8,232,826 B1
(45) Date of Patent: Jul. 31, 2012

(54) TECHNIQUES FOR MULTIPLEXING DELAYED SIGNALS

(75) Inventors: Andy Nguyen, San Jose, CA (US); Ling Yu, Cupertino, CA (US); Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 273 days.

(21) Appl. No.: 12/692,847

(22) Filed: Jan. 25, 2010

(51) Int. Cl.
*H03H 11/26* (2006.01)

(52) U.S. Cl. ......................................... 327/261; 327/276
(58) Field of Classification Search .................. None
See application file for complete search history.

(56) References Cited

U.S. PATENT DOCUMENTS

| | | | | |
|---|---|---|---|---|
| 6,400,735 | B1 * | 6/2002 | Percey | 370/518 |
| 7,138,844 | B2 * | 11/2006 | Lee et al. | 327/276 |
| 2009/0167397 | A1 * | 7/2009 | Chang et al. | 327/233 |

* cited by examiner

*Primary Examiner* — Cassandra Cox
(74) *Attorney, Agent, or Firm* — Steven J. Cahill (57) ABSTRACT

A circuit with N primary outputs and a delay chain with M selection multiplexers. M can be less than N, and M is based on the number of primary outputs that simultaneously require a delayed signal from the delay chain. The N primary outputs may include core outputs and/or registers. Each of the M selection multiplexers feed directly or indirectly a subset of the N primary outputs.

27 Claims, 9 Drawing Sheets

TECHNIQUES FOR MULTIPLEXING DELAYED SIGNALS

BACKGROUND

The present invention relates to electronic circuits, and more particularly, to techniques for multiplexing delayed signals.

Figure 1:
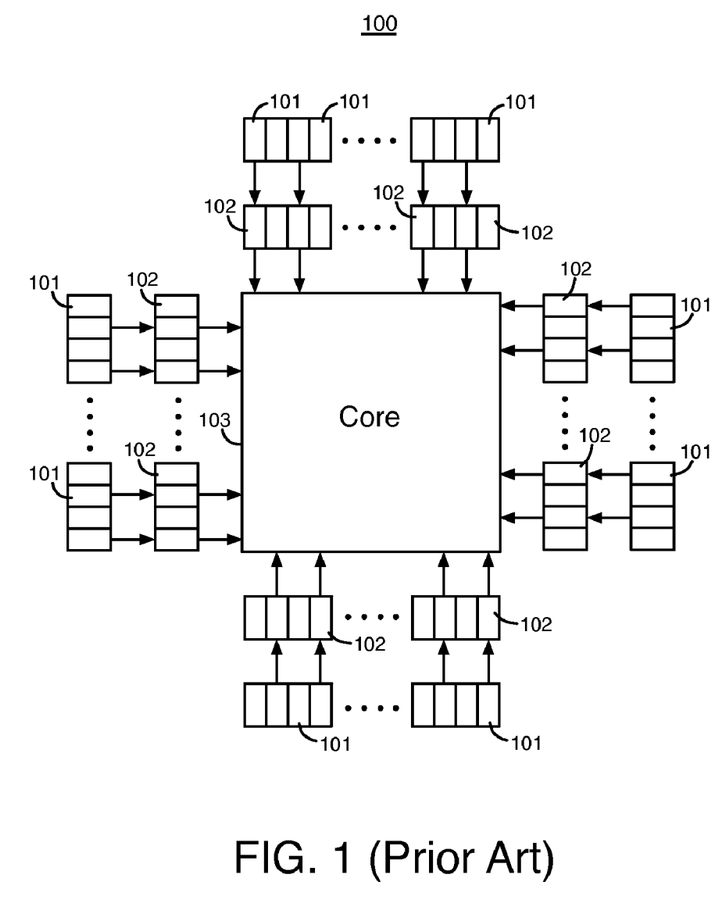
FIG. 1 illustrates an example of a prior art integrated circuit (IC).

FIG. 1 illustrates an example of a prior art integrated circuit (IC) 100. IC 100 includes several input driver circuits 101 and several input register circuit blocks 102. Input signals are driven from external sources outside IC 100 to core 103 through input driver circuits 101 and input register circuit blocks 102. IC 100 is a field programmable gate array, and core 103 includes numerous programmable logic circuits.

Figure 2:
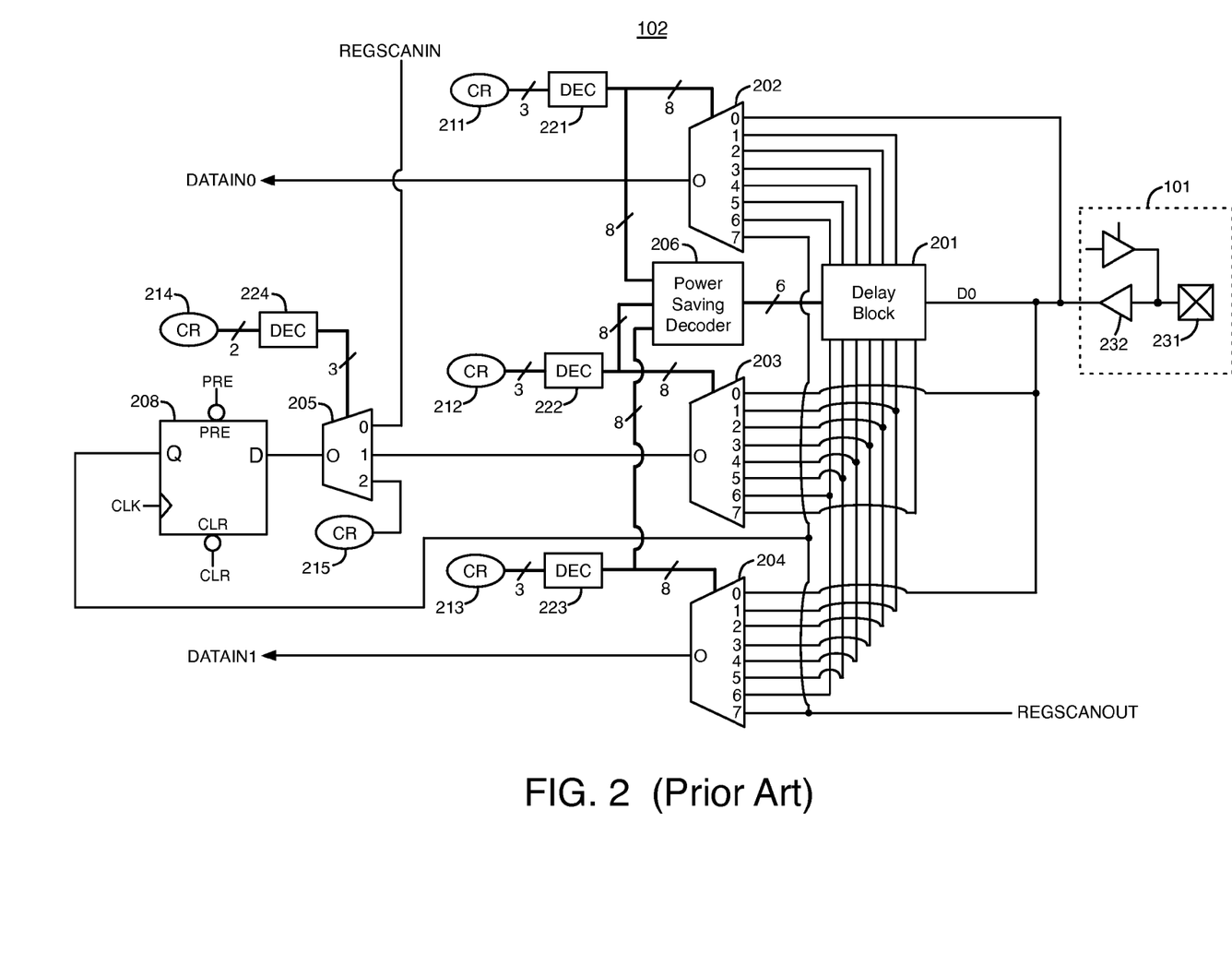
FIG. 2 illustrates prior art architectures of an input driver circuit and an input register circuit block.

FIG. 2 illustrates prior art architectures of an input driver circuit 101 and an input register circuit block 102. Input driver circuit 101 includes an external terminal pad 231 and an input buffer circuit 232. Input register circuit block 102 includes delay circuit block 201, multiplexers 202-205, power saving decoder 206, register 208, configuration random access memory (CRAM) circuits 211-215, and decoders 221-224.

An input signal can be driven from an external source into IC 100 through pad 231 to an input of input buffer 232. Buffer 232 drives the input signal to delay circuit block 201 as signal D0. Delay circuit block 201 delays signal D0 to generate delayed signals. The delayed signals are delayed by 45°, 90°, 135°, 180°, 225°, 270°, and 315° relative to signal D0, where 360° equals one period of signal D0. Six delayed signals are routed to the 1-6 inputs of multiplexers 202-204. A seventh delayed signal is routed to the 7 input of multiplexer 203.

The output signal generated at the O output of multiplexer 203 is routed to the 1 input of multiplexer 205. A register scan input signal REGSCANIN is routed to the 0 input of multiplexer 205. REGSCANIN can be used as a test signal. Memory circuits 211-215 store configuration memory signals. A configuration memory signal stored in memory circuit 215 is routed to the 2 input of multiplexer 205.

The output signal generated at the O output of multiplexer 205 is routed to the D input of register 208. Register 208 transmits the logic state at its D input to its Q output in response to a rising edge in a clock signal CLK. The signal stored at the Q output of register 208 is routed to the 7 input of multiplexer 202 and to the 7 input of multiplexer 204. The signal stored at the Q output of register 208 is also routed out of block 102 as a register scan output test signal REGSCANOUT. The signal stored at the Q output of register 208 is set to a logic high state by signal PRE and set to a logic low state by signal CLR.

Decoders 221-224 decode the configuration memory signals stored in memory circuits 211-214, respectively, to generate decoded signals. Each of the decoders 221-223 decodes 3 configuration memory signals to generate 8 decoded signals. The decoded signals generated by decoders 221-223 are routed to the select inputs of multiplexers 202-204, respectively. Decoder 224 decodes 2 configuration memory signals stored in memory circuit 214 to generate 3 decoded signals that are routed to the select inputs of multiplexer 205. The configuration memory signals stored in memory circuits 211-214 determine which input signals multiplexers 202-205, respectively, transmit to their O outputs. The output signals DATAIN0 and DATAIN1 at the O outputs of multiplexers 202 and 204, respectively, are routed to core 103.

The 24 decoded output signals of decoders 221, 222, and 223 are also routed to the inputs of power saving decoder 206. Power saving decoder 206 decodes the 24 decoded output signals of decoders 221-223 to generate 6 control signals that are routed to delay circuit block 201. Each of the delay circuits in delay circuit block 201 has a variable delay. The 6 control signals generated by decoder 206 determine the delays of the delay circuits in delay circuit block 201. The delays of the delay circuits in block 201 can be varied to generate delays of 45°, 90°, 135°, 180°, 225°, 270°, and 315° in the delayed signals relative to signal D0 for input signals D0 having different frequencies. The delays of the delay circuits in block 201 vary in response to changes in the logic states of the 6 control signals generated by decoder 206.

BRIEF SUMMARY

According to some embodiments, a circuit includes delay circuits, multiplexers, and a storage circuit. The delay circuits delay an input signal to generate delayed signals. The delayed signals are routed to inputs of first and second multiplexers. The circuit routes an output signal of the second multiplexer to an input of a third multiplexer and to an input of a fourth multiplexer. The circuit routes an output signal of the first multiplexer to an input of a fifth multiplexer. The storage circuit has an input coupled to receive an output signal of the third multiplexer.

Various objects, features, and advantages of the present invention will become apparent upon consideration of the following detailed description and the accompanying drawings.

DETAILED DESCRIPTION

Figure 3:
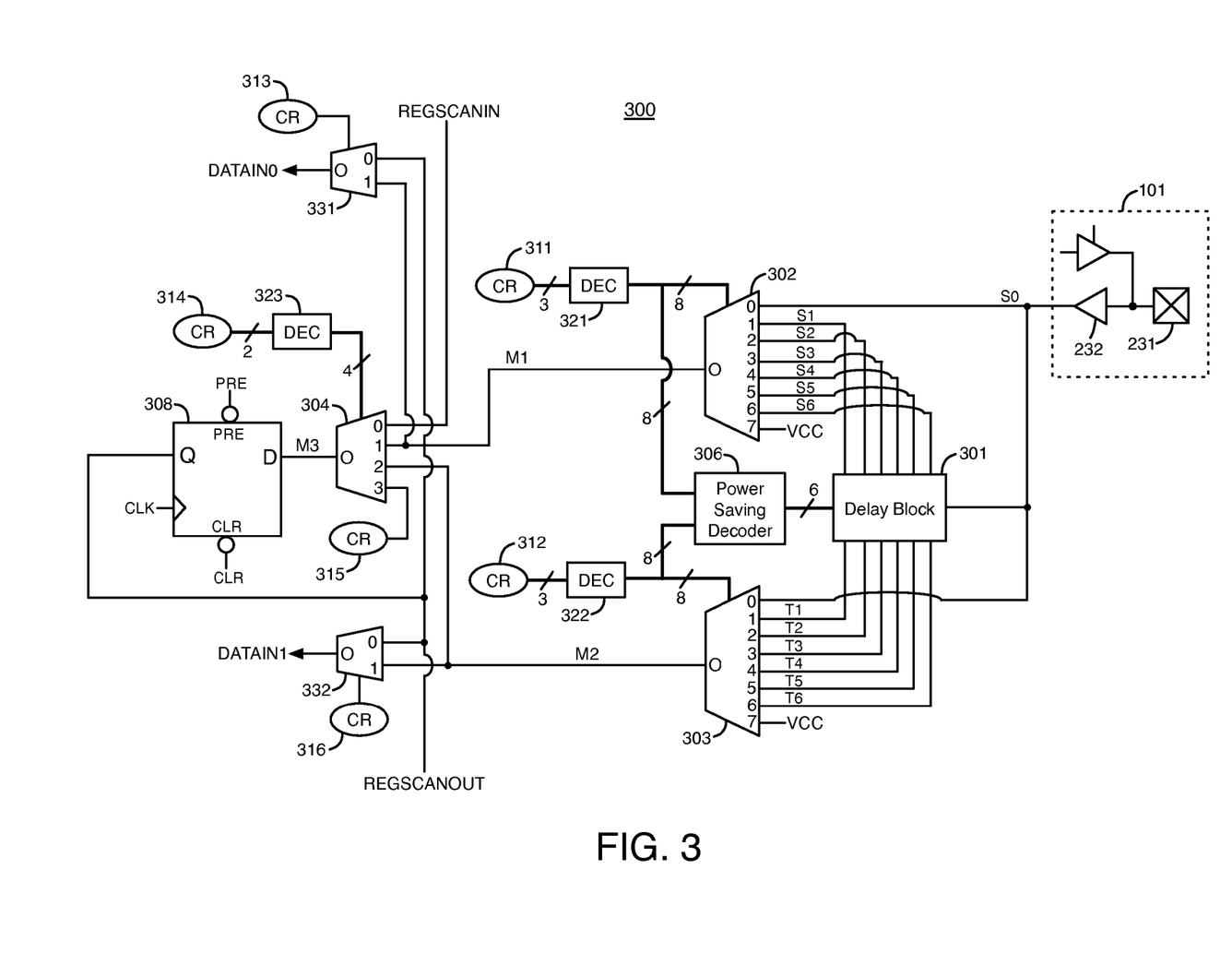
FIG. 3 illustrates an example of an input register circuit block, according to an embodiment of the present invention.

FIG. 3 illustrates an example of an architecture for an input register circuit block 300, according to an embodiment of the present invention. Input register circuit block 300 includes delay circuit block 301, multiplexers 302-304, power saving decoder 306, register 308, configuration random access memory (CRAM) circuits 311-316, decoders 321-323, and multiplexers 331-332. An input register circuit block 300 can be substituted for each of the input register circuit blocks 102 shown in FIG. 1 in IC 100.

In input driver circuit 101, buffer 232 drives an input signal from pad 231 to delay circuit block 301 as signal S0. Delay circuit block 301 contains adjustable delay circuits that delay the output signal S0 of buffer 232 to generate 6 delayed signals S1-S6 and 6 delayed signals T1-T6. The 6 delayed signals S1-S6 are delayed by 45°, 90°, 135°, 180°, 225°, and 270°, respectively, relative to signal S0. The 6 delayed signals T1-T6 are delayed by 45°, 90°, 135°, 180°, 225°, and 270°, respectively, relative to signal S0. 90° is one-quarter of a period of S0, and 180° is one-half of a period of S0. Signals S0-S6 are routed to the 0-6 inputs, respectively, of multiplexer 302. Signals S0 and T1-T6 are routed to the 0-6 inputs, respectively, of multiplexer 303. A supply voltage VCC is routed to the 7 input of each of multiplexers 302-303.

A register scan input signal REGSCANIN is routed to the 0 input of multiplexer 304. The output signal M1 generated at the O output of multiplexer 302 is routed to the 1 input of multiplexer 304 and to the 1 input of multiplexer 331. The output signal M2 generated at the O output of multiplexer 303 is routed to the 2 input of multiplexer 304 and to the 1 input of multiplexer 332. Memory circuits 311-316 store configuration memory signals. A configuration memory signal stored in memory circuit 315 is routed to the 3 input of multiplexer 304.

The output signal M3 generated at the O output of multiplexer 304 is routed to the D input of register 308. Register 308 stores the logic state of M3 at its Q output in response to a rising edge in a clock signal CLK. Register 308 synchronizes the output signal M3 of multiplexer 304 with the rising edges of clock signal CLK. Register 308 can synchronize any of signals S0-S6 or T1-T6 to clock signal CLK by configuring multiplexers 302-304 accordingly.

The signal stored at the Q output of register 308 is routed to the 0 input of multiplexer 331 and to the 0 input of multiplexer 332. Thus, the signal stored at the Q output of register 308 can be routed to the core circuitry through multiplexers 331 or 332. The signal stored at the Q output of register 308 is also routed out of block 300 as a register scan output signal REGSCANOUT.

Multiplexer 331 can be configured to route any of the signals S0-S6 and VCC from multiplexer 302 to the core circuitry. Multiplexer 332 can be configured to route any of the signals S0, T1-T6, and VCC from multiplexer 303 to the core circuitry. Multiplexers 331-332 can also be configured to route to the core circuitry versions of signals S0-S6 and T1-T6 that register 308 has synchronized with CLK.

The configuration memory signal stored in memory circuit 313 is routed to the select input of multiplexer 331. The logic state of the configuration memory signal stored in memory circuit 313 determines which of the input signals of multiplexer 331 are transmitted to the O output of multiplexer 331 as output signal DATAIN0.

The configuration memory signal stored in memory circuit 316 is routed to the select input of multiplexer 332. The logic state of the configuration memory signal stored in memory circuit 316 determines which of the input signals of multiplexer 332 are transmitted to the O output of multiplexer 332 as output signal DATAIN1. Signals DATAIN0 and DATAIN1 are routed to the core of the integrated circuit.

Input register circuit block 300 requires less circuitry than input register circuit block 102 shown in FIG. 2. Input register circuit block 300 has only two 8:1 multiplexers 302-303 and two 3:8 decoders 321-322. Input register circuit block 102 has three 8:1 multiplexers 202-204 and three 3:8 decoders 221-223. Also, power saving decoder 306 requires less circuitry to implement than power saving decoder 206, because power saving decoder 306 only decodes 16 input signals instead of 24 input signals. The reduction in circuitry in block 300 is particularly significant in an IC that uses hundreds or thousands of blocks 300 around the periphery of the IC.

Input register circuit block 300 has significantly less leakage current and significantly less dynamic current than block 102, because block 300 has less circuitry than block 102. If one of multiplexers 302 or 303 is not being used to transmit an input signal to the core of the IC, that multiplexer can be configured to transmit the static supply voltage VCC at its 7 input to its O output to provide a further reduction in the dynamic current and the power used by block 300.

Input register circuit block 300 has two additional 2:1 multiplexers 331-332 that are not in input register circuit block 102. However, multiplexers 331-332 require substantially less circuitry than the third 8:1 multiplexer and the third 3:8 decoder in block 102.

Decoders 321-322 decode the configuration memory signals stored in memory circuits 311-312, respectively, to generate decoded signals. Each of the decoders 321-322 decodes 3 configuration memory signals to generate 8 decoded signals. The decoded signals generated by decoders 321 and 322 are routed to the select inputs of multiplexers 302 and 303, respectively. Decoder 323 decodes 2 configuration memory signals stored in memory circuit 314 to generate 4 decoded signals that are routed to the select inputs of multiplexer 304. The configuration memory signals stored in memory circuits 311, 312 and 314 determine which of the input signals of multiplexers 302-304 are transmitted to the O outputs of multiplexers 302-304, respectively.

The 16 decoded output signals of decoders 321-322 are also routed to the inputs of power saving decoder 306. Power saving decoder 306 decodes the 16 decoded output signals of decoders 321 and 322 to generate 6 control signals that are routed to delay circuit block 301. Each of the adjustable delay circuits in delay circuit block 301 has a variable delay. The 6 control signals generated by decoder 306 determine the delays of the adjustable delay circuits in delay circuit block 301. The delays of the adjustable delay circuits in block 301 can be varied to generate delays of 45°, 90°, 135°, 180°, 225°, and 270° in signals S1-S6 and T1-T6, respectively, relative to signal S0 for input signals S0 having different frequencies. The delays of the adjustable delay circuits in block 301 vary in response to changes in the logic states of the 6 control signals generated by decoder 306.

Figure 4:
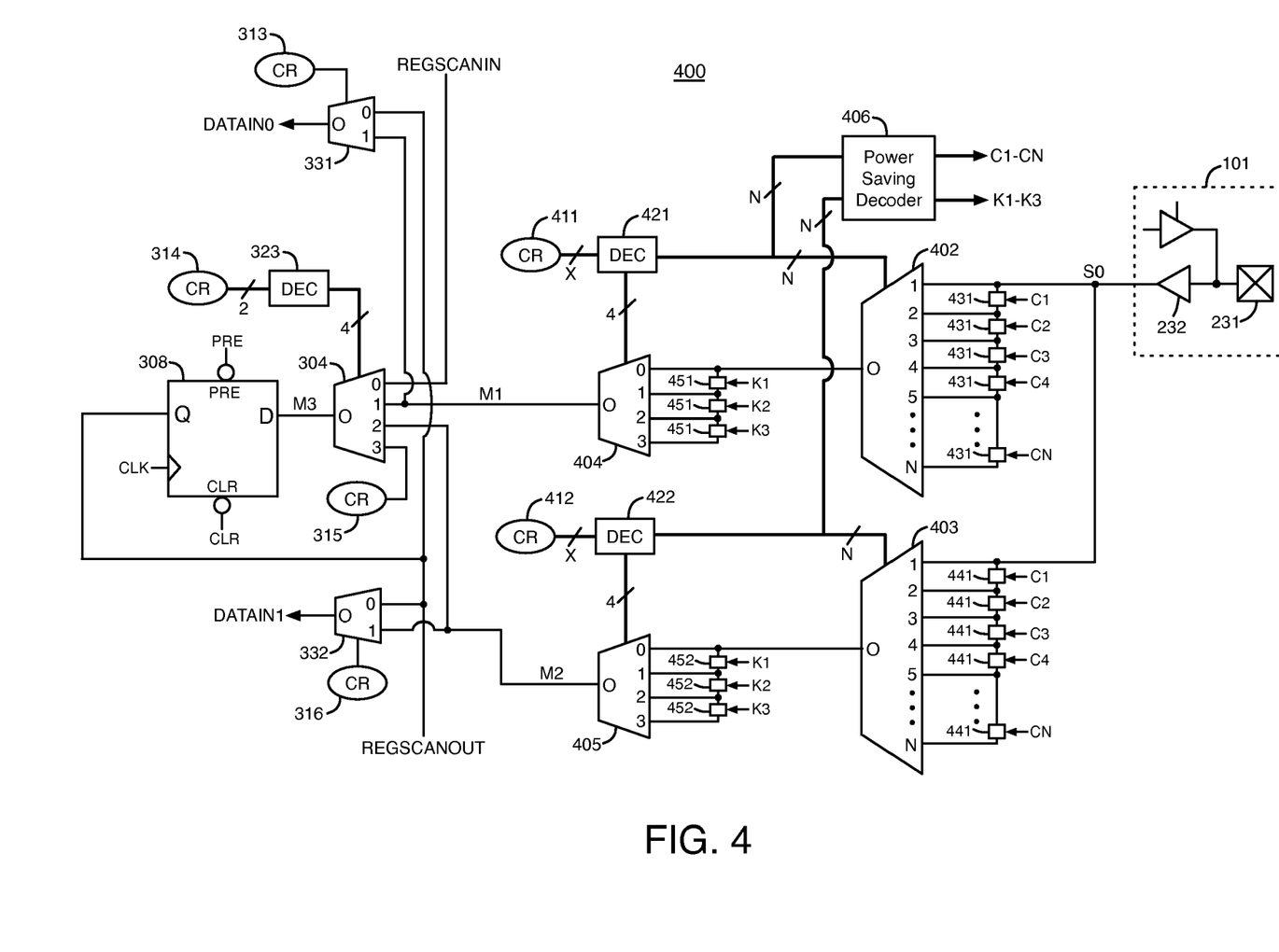
FIG. 4 illustrates another example of an input register circuit block, according to an embodiment of the present invention.

FIG. 4 illustrates an example of an architecture for an input register circuit block 400, according to another embodiment of the present invention. Input register circuit block 400 includes multiplexers 304 and 402-405, power saving decoder 406, register 308, configuration random access memory (CRAM) circuits 411-412 and 313-316, decoders 421-422 and 323, multiplexers 331-332, N−1 adjustable delay circuits 431, N−1 adjustable delay circuits 441, and 6 adjustable delay circuits 451-452. An input register circuit block 400 can be substituted for each of the input register circuit blocks 102 shown in FIG. 1 in IC 100.

Input register circuit block 400 includes two N:1 multiplexers 402-403, two 4:1 multiplexers 404-405, and delay circuits 431, 441, and 451-452 instead of two 8:1 multiplexers 302-303 and delay circuit block 301. Multiplexers 402-403 can be any desired size. For example, multiplexers 402-403 can be 12:1 multiplexers or 16:1 multiplexers.

N:1 multiplexers 402-403 and 4:1 multiplexers 404-405 function as two multiplexers that each have 4×N input signals and one output signal. For example, if multiplexers 402-403 are 12:1 multiplexers, then multiplexers 402-403 and multiplexers 404-405 function as two 48:1 multiplexers. Using this example, input register circuit block 400 requires substantially less circuitry than an input register circuit block that has three 48:1 multiplexers to perform the same functions as block 400.

The output signal S0 of buffer 232 is routed to the 1 inputs of multiplexers 402-403. Adjustable delay circuits 431 delay signal S0 to provide delayed input signals to the 2-N inputs of multiplexer 402. Adjustable delay circuits 441 delay signal S0 to provide delayed input signals to the 2-N inputs of multiplexer 403. Delay circuits 431 and 441 delay signal S0 by P/N, 2P/N, 3P/N, 4P/N, etc., where P is the period of signal S0, and N is the number of multiplexing inputs of each of multiplexers 402-403.

The output signals of multiplexers 402-403 are routed to the 0 inputs of multiplexers 404-405, respectively. Adjustable delay circuits 451 delay the output signal of multiplexer 402 to provide delayed input signals to the 1-3 inputs of multiplexer 404. Adjustable delay circuits 452 delay the output signal of multiplexer 403 to provide delayed input signals to the 1-3 inputs of multiplexer 405.

Thus, multiplexers 402 and 404 implement a first multiplexing function that selects output signal M1 among 4×N delayed versions of input signal S0. Multiplexers 403 and 405 implement a second multiplexing function that selects output signal M2 among 4×N delayed versions of input signal S0.

Decoder 421 decodes X signals stored in memory circuit 411 to generate 4 decoded signals that are routed to the select inputs of multiplexer 404 and N decoded signals that are routed to the select inputs of multiplexer 402. Decoder 422 decodes X signals stored in memory circuit 412 to generate 4 decoded signals that are routed to the select inputs of multiplexer 405 and N decoded signals that are routed to the select inputs of multiplexer 403. The decoded signals routed to the select inputs of multiplexers 402-405 determine which input signals of the multiplexers are transmitted to the O outputs of the multiplexers. The output signal M1 of multiplexer 404 is routed to the 1 input of multiplexer 304 and to the 1 input of multiplexer 331. The output signal M2 of multiplexer 405 is routed to the 1 input of multiplexer 332 and to the 2 input of multiplexer 304.

Power saving decoder 406 decodes the N decoded signals generated by decoder 421 and the N decoded signals generated by decoder 422 to generate control signals C1-CN and K1-K3. Control signals C1-CN determine the delays of variable delay circuits 431 and 441 as shown in FIG. 4. Control signals K1-K3 determine the delays of variable delay circuits 451 and 452 as shown in FIG. 4.

According to additional embodiments, input register circuit block 400 of FIG. 4 can be modified such that one or more of a static supply voltage and the signal stored at the Q output of register 308 are routed to inputs of multiplexers 402-403. Alternatively, input register circuit block 400 can be modified such that input signal S0 is routed to an input of each of multiplexers 331-332 in addition to the input signals to multiplexers 331-332 shown in FIG. 4 or instead of one of the illustrated input signals. As another alternative embodiment of FIG. 4, input signal S0 may not be routed to inputs of multiplexers 402-403.

Figure 5:
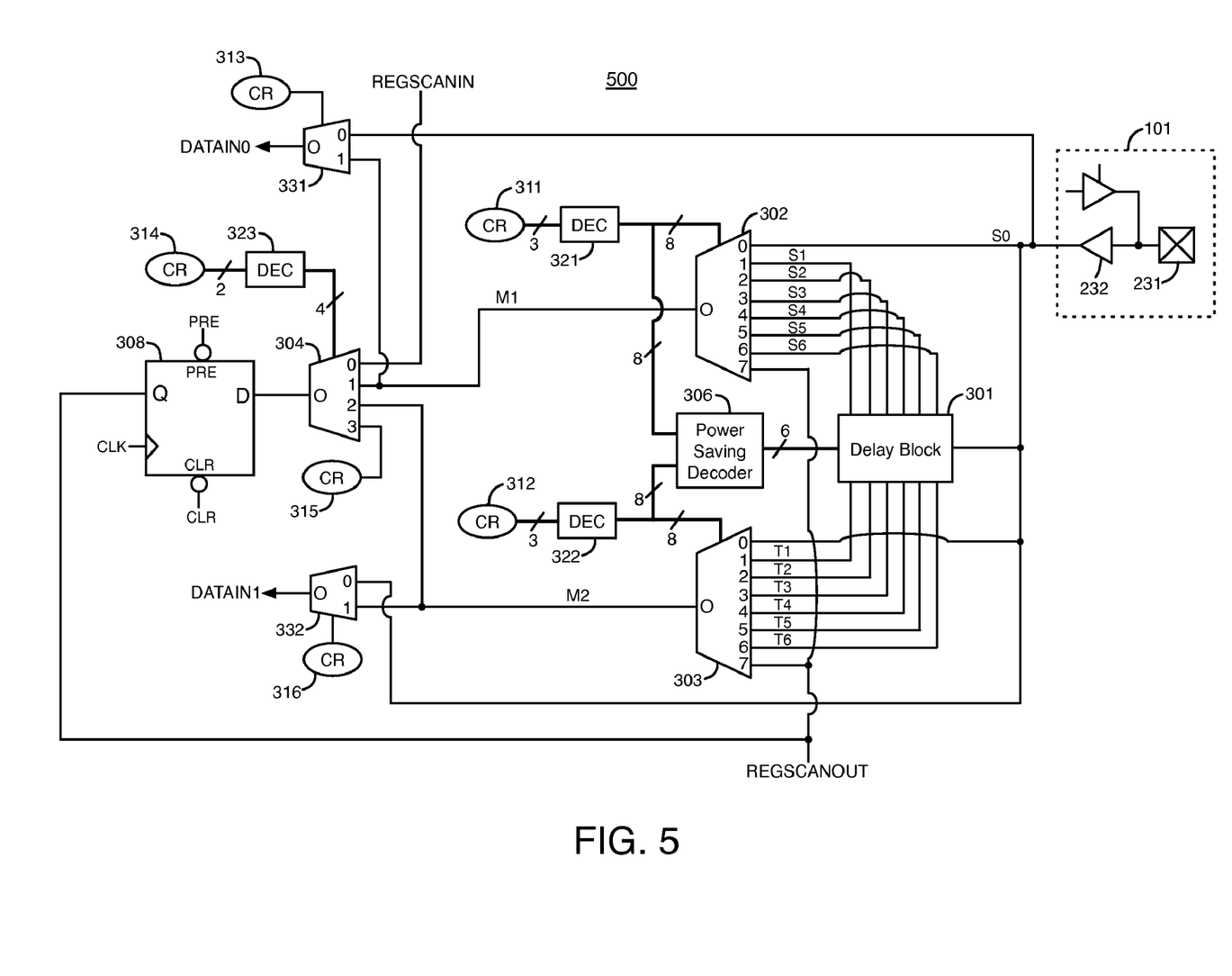
FIG. 5 illustrates another example of an input register circuit block, according to an embodiment of the present invention.

FIG. 5 illustrates an example of an architecture for an input register circuit block 500, according to yet another embodiment of the present invention. Input register circuit block 500 includes delay circuit block 301, multiplexers 302-304, power saving decoder 306, register 308, configuration random access memory (CRAM) circuits 311-316, decoders 321-323, and multiplexers 331-332. An input register circuit block 500 can be substituted for each of the input register circuit blocks 102 shown in FIG. 1 in IC 100.

One difference between input register circuit block 300 in FIG. 3 and input register circuit block 500 is that the input signal S0 is routed directly to inputs of multiplexers 331-332 in input register circuit block 500 as shown in FIG. 5. As a result, input register circuit block 500 provides direct and fast paths for the input signal to be routed to the core circuitry in the integrated circuit without being transmitted through multiplexers 302 or 303.

Another difference between input register circuit block 300 and input register circuit block 500 is that in block 500 the output signal stored at the Q output of register 308 is routed to the 7 inputs of multiplexers 302 and 303. In block 500, the output signal stored at the Q output of register 308 is not routed directly to inputs of multiplexers 331-332 as in block 300. Register 308 can generate a test output signal REG-SCANOUT at its Q output in response to receiving a test input signal REGSCANIN from multiplexer 304 during a test mode of block 500.

Figure 6:
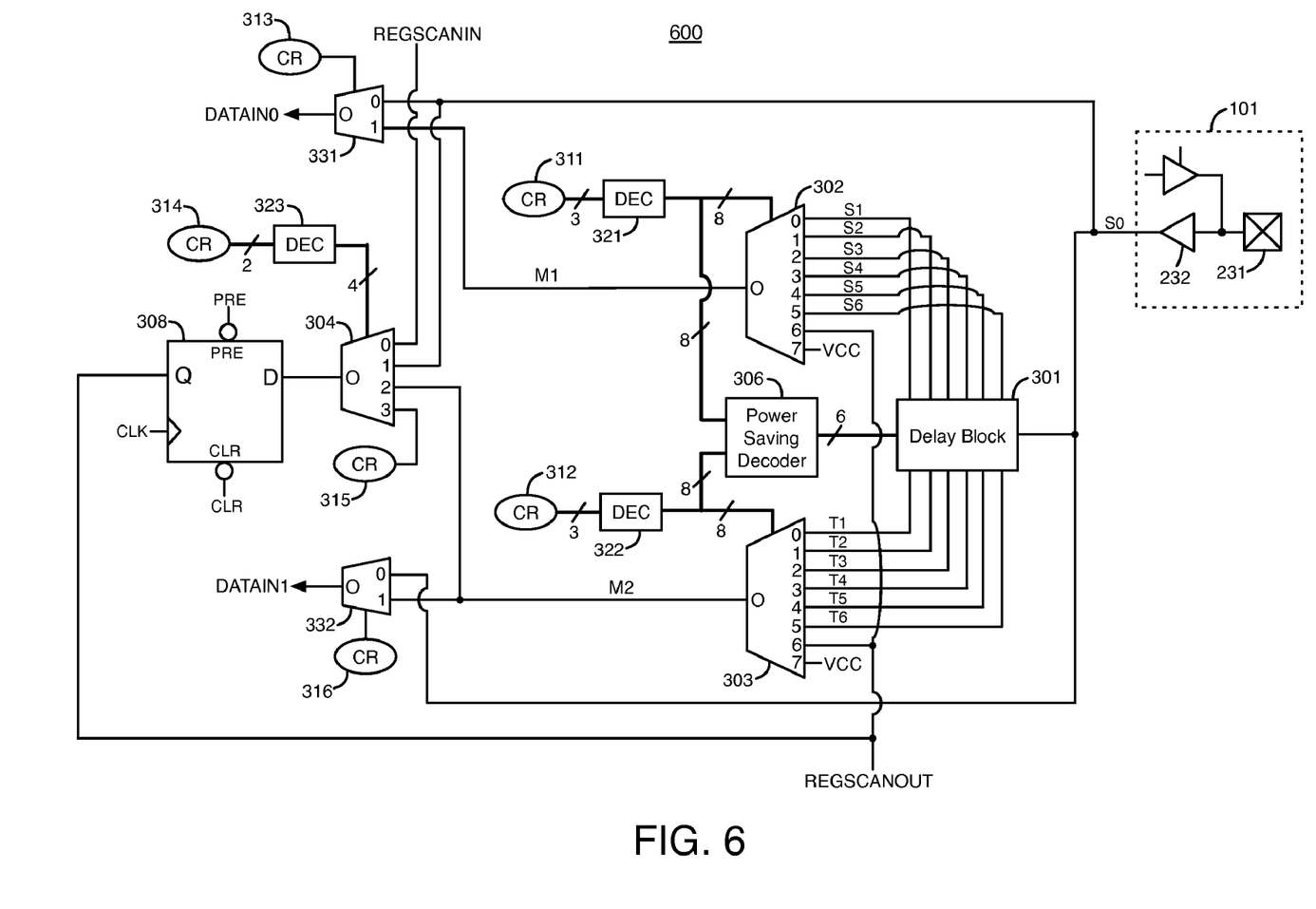
FIG. 6 illustrates yet another example of an input register circuit block, according to an embodiment of the present invention.

FIG. 6 illustrates an example of an architecture for an input register circuit block 600, according to yet another embodiment of the present invention. Input register circuit block 600 includes delay circuit block 301, multiplexers 302-304, power saving decoder 306, register 308, configuration random access memory (CRAM) circuits 311-316, decoders 321-323, and multiplexers 331-332. An input register circuit block 600 can be substituted for each of the input register circuit blocks 102 shown in FIG. 1 in IC 100.

One difference between input register circuit blocks 300 and 500 and input register circuit block 600 in FIG. 6 is that input signal S0 is not routed directly to inputs of multiplexers 302 and 303 in input register circuit block 600. In input register circuit block 600, delayed signals S1-S6 are routed to the 0-5 inputs of multiplexer 302, and delayed signals T1-T6 are routed to the 0-5 inputs of multiplexer 303. In input register circuit block 600, the signal stored at the Q output of register 308 is routed to the 6 input of multiplexer 302 and to the 6 input of multiplexer 303. In addition, a static supply voltage VCC is routed to the 7 input of multiplexer 302 and to the 7 input of multiplexer 303 in block 600. An unused multiplexer 302 or 303 can select the static signal VCC to reduce power consumption.

In input register circuit block 600, the input signal S0 is routed to inputs of multiplexers 331-332, as in input register circuit bock 500. Thus, input register circuit block 600 also has fast paths for the transmission of input signal S0 to the core circuitry in the integrated circuit that bypass multiplexers 302 and 303.

The input signal S0 is also routed to the 1 input of multiplexer 304 in input register circuit block 600. Multiplexer 304 can be configured to transmit S0 to the D input of register 308, and register 308 can synchronize input signal S0 with clock signal CLK by storing the logic state of S0 at its Q output in response to rising edges in CLK. The output signal M1 of multiplexer 302 is not routed to an input of multiplexer 304 in block 600.

Figure 7:
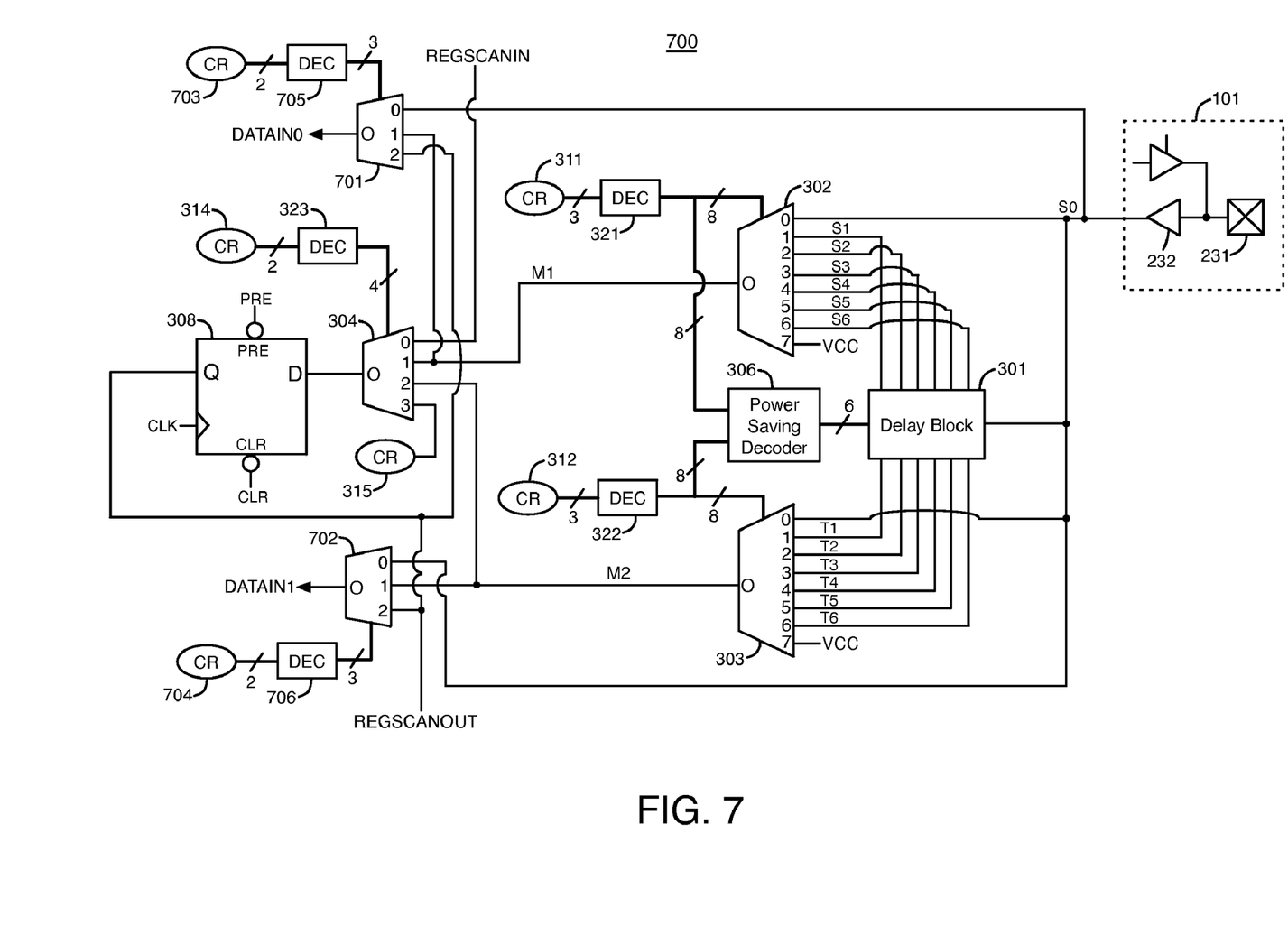
FIG. 7 illustrates yet another example of an input register circuit block, according to an embodiment of the present invention.

FIG. 7 illustrates an example of an architecture for an input register circuit block 700, according to still another embodiment of the present invention. Input register circuit block 700 includes delay circuit block 301, multiplexers 302-304, power saving decoder 306, register 308, configuration random access memory (CRAM) circuits 311-312, 314-315, and 703-704, decoders 321-323 and 705-706, and multiplexers 701-702. An input register circuit block 700 can be substituted for each of the input register circuit blocks 102 shown in FIG. 1 in IC 100.

In input register circuit block 700, the input signal S0 is routed directly to the 0 inputs of multiplexers 302-303, as in blocks 300 and 500. Also, a static supply voltage VCC is routed to the 7 input of multiplexer 302 and to the 7 input of multiplexer 303 in block 700, as in blocks 300 and 600. According to alternative embodiments, the static supply voltage VCC input to the multiplexers 302-303 in the input register circuit blocks 300, 600, and 700 shown in FIGS. 3, 6, and 7 can be substituted with an additional delay signal generated by an additional adjustable delay circuit in delay block 301.

In input register circuit block 700, the delayed signals S1-S6 generated by delay block 301 are routed to the 1-6 inputs, respectively, of multiplexer 302, and the delayed signals T1-T6 generated by delay block 301 are routed to the 1-6 inputs, respectively, of multiplexer 303. The output signal M1 of multiplexer 302 is routed to the 1 input of multiplexer 304 in input register circuit 700. Register 308 can synchronize signal REGSCANIN, M1, M2, or the signal stored in memory circuit 315 to clock signal CLK. The signal stored at the Q output of register 308 is routed to inputs of multiplexers 701-702. The signal stored at the Q output of register 308 can also be used as a test REGSCANOUT signal that is generated in response to a test REGSCANIN signal, as with the previous embodiments.

The input signal S0 is routed directly to multiplexers 701-702 in input register circuit block 700 to provide a fast and direct path to the core circuitry. The output signals DATAIN0 and DATAIN1 of multiplexers 701-702, respectively, are routed to the core circuitry.

Multiplexers 701 and 702 are 3:1 multiplexers. The input signal S0, the output signal M1 of multiplexer 302, and the signal stored at the Q output of register 308 are routed to the 0, 1, and 2 inputs, respectively, of multiplexer 701. Thus, multiplexer 701 can transmit either S0, M1, or the Q output signal of register 308 to the core circuitry. The input signal S0, the output signal M2 of multiplexer 303, and the signal stored at the Q output of register 308 are routed to the 0, 1, and 2 inputs, respectively, of multiplexer 702. Thus, multiplexer 702 can transmit either S0, M2, or the Q output signal of register 308 to the core circuitry.

Memory circuits 703-704 each store 2 configuration memory signals. Decoders 705-706 decode the signals stored in memory circuits 703-704, respectively, to generate decoded signals. Each of the decoders 705 and 706 generates 3 decoded signals. The decoded signals generated by decoders 705-706 are routed to the select inputs of multiplexers 701-702, respectively. The configuration memory signals stored in memory circuits 703-704 determine which input signals multiplexers 701-702, respectively, transmit to their O outputs.

Figure 8:
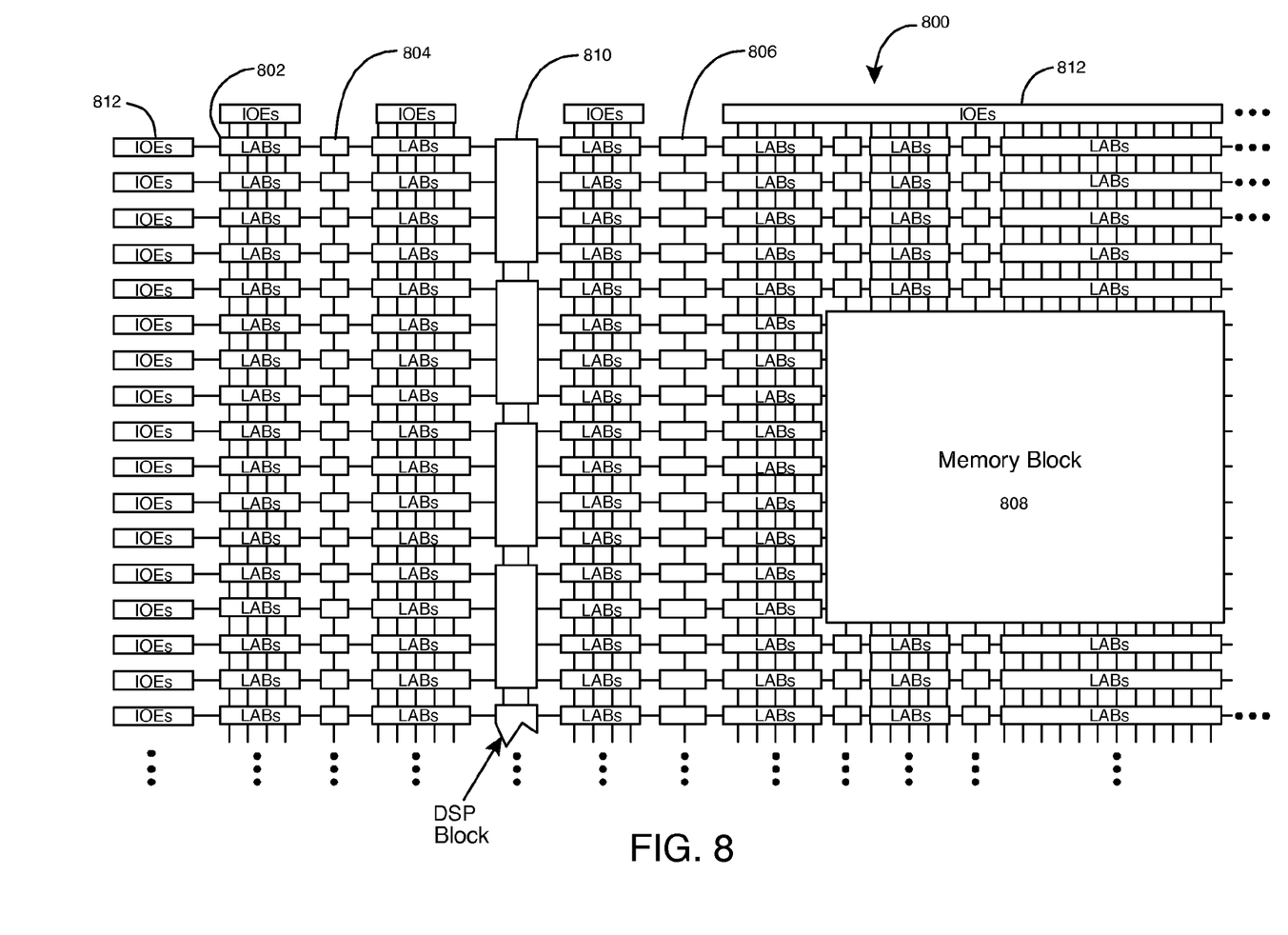
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic circuit block that provides for efficient implementation of user defined logic functions.

An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 located, in this example, around the periphery of the chip, support numerous single-ended and differential input/output standards. IOEs 812 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 800 is described herein for illustrative purposes only and that the present invention can be implemented in many different types of integrated circuits.

Figure 9:
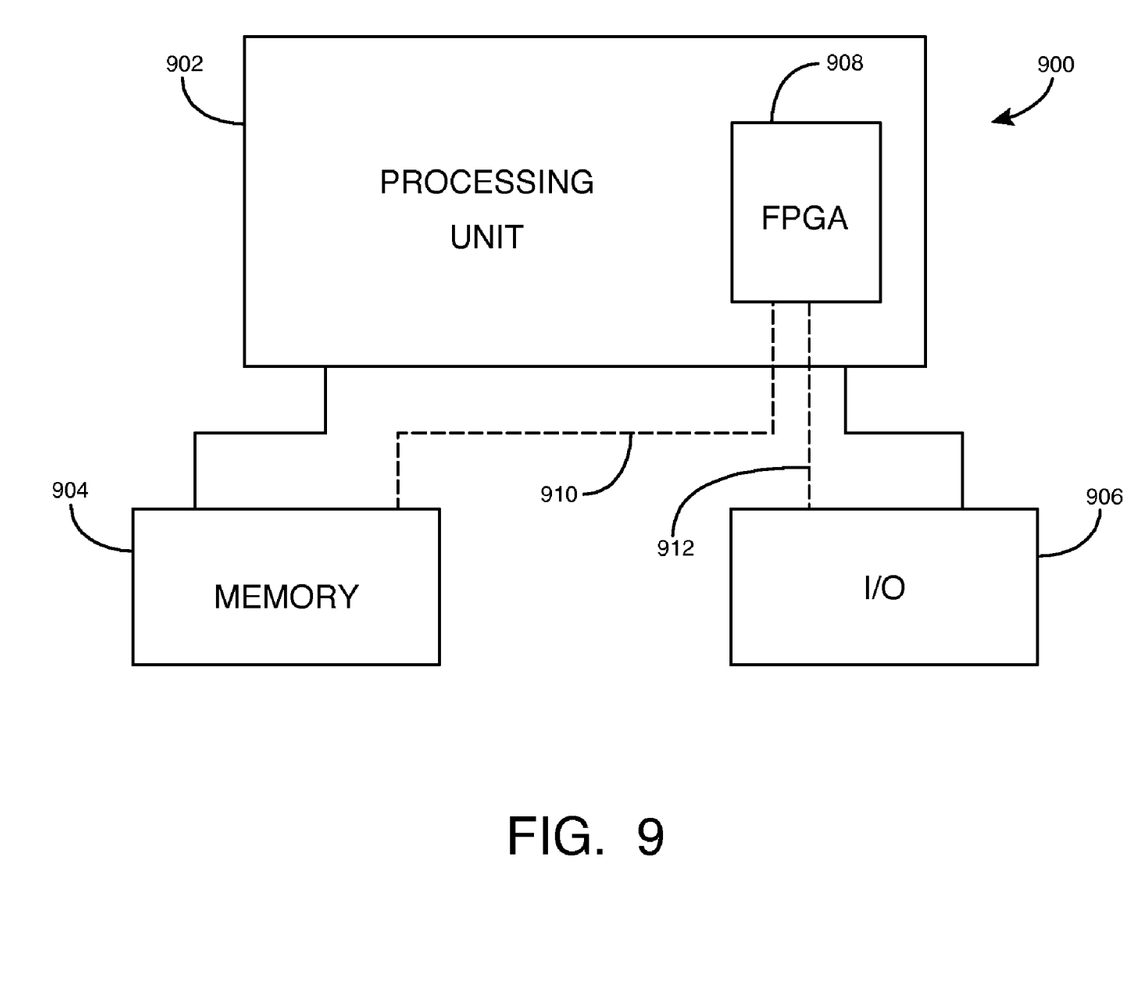
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   delay circuits operable to delay an input signal to generate delayed signals;
   first and second multiplexers, wherein the circuit is operable to provide the delayed signals to inputs of the first and the second multiplexers;
   third and fourth multiplexers, wherein the circuit is operable to provide an output signal of the second multiplexer to a first input of the third multiplexer and to a first input of the fourth multiplexer;
   a fifth multiplexer, wherein the circuit is operable to provide an output signal of the first multiplexer to a first input of the fifth multiplexer, and wherein the circuit is operable to provide the output signal of the first multiplexer to a second input of the third multiplexer; and
   a storage circuit having an input operable to receive an output signal of the third multiplexer.

2. The circuit of claim 1 wherein the circuit is operable to provide an output signal of the storage circuit to a second input of the fourth multiplexer and to a second input of the fifth multiplexer.

3. The circuit of claim 1 wherein the circuit is operable to provide the input signal directly to an input of the first multiplexer and to an input of the second multiplexer.

4. A circuit comprising:
   delay circuits operable to delay an input signal to generate delayed signals;
   first and second multiplexers, wherein the circuit is operable to provide the delayed signals to the first and the second multiplexers;
   third and fourth multiplexers, wherein the circuit is operable to provide an output signal of the second multiplexer to an input of the third multiplexer and to an input of the fourth multiplexer;
   a fifth multiplexer, wherein the circuit is operable to provide an output signal of the first multiplexer to an input of the fifth multiplexer; and
   a storage circuit having an input operable to receive an output signal of the third multiplexer,
   wherein the first multiplexer is configurable to select a supply voltage as the output signal of the first multiplexer, and the second multiplexer is configurable to select the supply voltage as the output signal of the second multiplexer.

5. The circuit of claim 1 wherein each of the first and the second multiplexers receives at least 12 of the delayed signals from the delay circuits.

6. A circuit comprising:
   delay circuits operable to delay an input signal to generate delayed signals;
   first and second multiplexers, wherein the circuit is operable to provide the delayed signals to the first and the second multiplexers;
   third and fourth multiplexers, wherein the circuit is operable to provide an output signal of the second multiplexer to an input of the third multiplexer and to an input of the fourth multiplexer;
   a fifth multiplexer, wherein the circuit is operable to provide an output signal of the first multiplexer to an input of the fifth multiplexer; and
   a storage circuit having an input operable to receive an output signal of the third multiplexer,
   wherein the circuit is operable to provide an output signal of the storage circuit to an input of the first multiplexer and to an input of the second multiplexer.

7. The circuit of claim 1 wherein the circuit is operable to provide the input signal to a second input of the fourth multiplexer and to a second input of the fifth multiplexer.

8. A circuit comprising:
   delay circuits operable to delay an input signal to generate delayed signals;
   first and second multiplexers, wherein the circuit is operable to provide the delayed signals to the first and the second multiplexers;
   third and fourth multiplexers, wherein the circuit is operable to provide an output signal of the second multiplexer to a first input of the third multiplexer and to a first input of the fourth multiplexer;
   a fifth multiplexer, wherein the circuit is operable to provide an output signal of the first multiplexer to a first input of the fifth multiplexer; and
   a storage circuit comprising an input that is operable to receive an output signal of the third multiplexer,
   wherein the circuit is operable to provide the input signal to a second input of the fourth multiplexer and to a second input of the fifth multiplexer.

9. The circuit of claim 8 wherein the circuit is operable to provide the input signal to a second input of the third multiplexer.

10. The circuit of claim 8 wherein the circuit is operable to provide an output signal of the storage circuit to a third input of the fourth multiplexer and to a third input of the fifth multiplexer.

11. A circuit comprising:
    first delay circuits operable to delay an input signal to generate first delayed signals;
    first and second multiplexers, wherein the circuit is operable to provide the first delayed signals to the first and the second multiplexers;
    third, fourth, and fifth multiplexers;
    a storage circuit comprising an input that is operable to receive an output signal of the third multiplexer;
    second delay circuits operable to delay an output signal of the first multiplexer to generate second delayed signals;
    a sixth multiplexer that is configurable to select one of the second delayed signals to be provided to an input of the fifth multiplexer;
    third delay circuits operable to delay an output signal of the second multiplexer to generate third delayed signals; and
    a seventh multiplexer that is configurable to select one of the third delayed signals to be provided to an input of the third multiplexer and to the first an input of the fourth multiplexer.

12. A circuit comprising:
    first delay circuits that delay an input signal to generate first delayed signals;
    first and second multiplexers, wherein the first delayed signals are routed to inputs of the first and the second multiplexers;

third and fourth multiplexers, wherein the circuit routes one of the first delayed signals through the second multiplexer to a first input of the third multiplexer and to a first input of the fourth multiplexer;

a fifth multiplexer, wherein the circuit routes one of the first delayed signals through the first multiplexer to a first input of the fifth multiplexer and to a second input of the third multiplexer; and a register that stores a state of an output signal of the third multiplexer in response to a periodic signal.

13. The circuit of claim 12 further comprising:

second delay circuits that delay an output signal of the first multiplexer to generate second delayed signals; and a sixth multiplexer that is configurable to select one of the second delayed signals for transmission to an output of the sixth multiplexer, wherein an output signal generated at the output of the sixth multiplexer is routed to the first input of the fifth multiplexer.

14. The circuit of claim 13 further comprising:

third delay circuits that delay an output signal of the second multiplexer to generate third delayed signals; and a seventh multiplexer that is configurable to select one of the third delayed signals for transmission to an output of the seventh multiplexer, wherein an output signal generated at the output of the seventh multiplexer is routed to the first input of the third multiplexer and to the first input of the fourth multiplexer.

15. The circuit of claim 12 wherein an output signal of the register is routed to a second input of the fourth multiplexer and to a second input of fifth multiplexer.

16. The circuit of claim 12 wherein the input signal is routed directly to an input of the first multiplexer and to an input of the second multiplexer.

17. The circuit of claim 12 wherein the input signal is routed to a second input of the fourth multiplexer and to a second input of the fifth multiplexer.

18. The circuit of claim 12 wherein the second multiplexer is configurable to route a supply voltage through the second multiplexer to the first input of the third multiplexer and to the first input of the fourth multiplexer, and the first multiplexer is configurable to route the supply voltage through the first multiplexer to the first input of the fifth multiplexer.

19. The circuit of claim 12 wherein the circuit is in an integrated circuit, and the first delay circuits have adjustable delays.

20. A method comprising:

delaying an input signal to generate delayed signals;

selecting one of the delayed signals using a first multiplexer to generate a first selected signal;

selecting one of the delayed signals using a second multiplexer to generate a second selected signal;

routing the second selected signal to a first input of a third multiplexer and to a first input of a fourth multiplexer;

routing the first selected signal to a first input of a fifth multiplexer and to a second input of the third multiplexer; and storing an output signal of a storage circuit based on an output signal of the third multiplexer in response to a periodic signal.

21. A method comprising:

delaying an input signal to generate first delayed signals;

selecting one of the first delayed signals using a first multiplexer to generate a first selected signal;

selecting one of the first delayed signals using a second multiplexer to generate a second selected signal;

routing the second selected signal to an input of a third multiplexer and to an input of a fourth multiplexer;

delaying the first selected signal to generate second delayed signals;

selecting one of the second delayed signals using a fifth multiplexer to generate a third selected signal that is routed to an input of a sixth multiplexer; and storing an output signal of a storage circuit based on an output signal of the third multiplexer.

22. The method of claim 21 wherein routing the second selected signal to an input of a third multiplexer and to an input of a fourth multiplexer further comprises:

delaying the second selected signal to generate third delayed signals; and selecting one of the third delayed signals using a seventh multiplexer to generate a fourth selected signal that is routed to the input of the third multiplexer and to the input of the fourth multiplexer.

23. A method comprising:

delaying an input signal to generate delayed signals;

selecting one of the delayed signals using a first multiplexer to generate a first selected signal;

selecting one of the delayed signals using a second multiplexer to generate a second selected signal;

routing the second selected signal to an input of a third multiplexer and to an input of a fourth multiplexer;

routing the first selected signal to an input of a fifth multiplexer;

storing an output signal of a storage circuit based on an output signal of the third multiplexer;

selecting a supply voltage to generate the first selected signal; and selecting the supply voltage to generate the second selected signal.

24. The method of claim 20 further comprising:

routing the output signal of the storage circuit to a second input of the fourth multiplexer and to a second input of the fifth multiplexer.

25. A method comprising:

delaying an input signal to generate delayed signals;

selecting one of the delayed signals using a first multiplexer to generate a first selected signal;

selecting one of the delayed signals using a second multiplexer to generate a second selected signal;

routing the second selected signal to an input of a third multiplexer and to a first input of a fourth multiplexer;

routing the first selected signal to a first input of a fifth multiplexer;

routing the input signal to a second input of the fourth multiplexer and to a second input of the fifth multiplexer; and storing an output signal of a storage circuit based on an output signal of the third multiplexer.

26. The method of claim 20 further comprising:

routing the output signal of the storage circuit to an input of the first multiplexer and to an input of the second multiplexer.

27. The method of claim 26 further comprising:

routing the input signal to a second input of the fourth multiplexer and to a second input of the fifth multiplexer.

* * * * *